United States Patent
Xu et al.

(10) Patent No.: US 9,958,974 B2
(45) Date of Patent: May 1, 2018

(54) TOUCH SUBSTRATE, ITS MANUFACTURING METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Rui Xu, Beijing (CN); Xiaoliang Ding, Beijing (CN); Xiaochuan Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days. days.

(21) Appl. No.: 15/209,191

(22) Filed: Jul. 13, 2016

(65) Prior Publication Data

US 2017/0242514 A1    Aug. 24, 2017

(30) Foreign Application Priority Data

Feb. 19, 2016    (CN) .......................... 2016 1 0094893

(51) Int. Cl.
*G06F 3/047*        (2006.01)
*G06F 3/041*        (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC .... G06F 3/0412; G06F 3/0416; G06F 3/0426; G06F 3/044; G06F 3/045; G06F 3/0487;
(Continued)

(56) References Cited

U.S. PATENT DOCUMENTS

2010/0231543 A1    9/2010  Momose
2013/0050126 A1*   2/2013  Kimura ............... G02F 1/13338
                                                           345/173
(Continued)

FOREIGN PATENT DOCUMENTS

CN    1815493 A    8/2006
CN    104951171 A   9/2015

OTHER PUBLICATIONS

First Office Action regarding Chinese application No. 201610094893.X, dated Jul. 25, 2016. Translation provided by Dragon Intellectual Property Law Firm.

*Primary Examiner* — Vinh T Lam
(74) *Attorney, Agent, or Firm* — Harness, Dickey & Pierce, P.L.C.

(57) ABSTRACT

The present disclosure provides a touch substrate, its manufacturing method and a display device. The touch substrate includes a base substrate provided with a plurality of via-holes, a first electrode arranged at a first surface of the base substrate and covering the plurality of via-holes, and a plurality of second electrodes arranged at a second surface of the base substrate opposite to the first surface and each located at a position corresponding to a touch region. An elastic conductor is arranged in each via-hole so as to electrically connect the first electrode to at least one of the second electrodes in the case that the base substrate is being pressed. Each second electrode corresponds to at least one elastic conductor. The first electrode is connected to a bias voltage input end, and the second electrodes are each (Continued)

connected to a respective detection signal output end via a respective detection line.

19 Claims, 4 Drawing Sheets

(51) Int. Cl.
*G06F 3/044* (2006.01)
*G02F 1/1333* (2006.01)
*H01L 27/32* (2006.01)

(52) U.S. Cl.
CPC ............ *G06F 2203/04103* (2013.01); *G06F 2203/04111* (2013.01); *H01L 27/323* (2013.01)

(58) Field of Classification Search
CPC ............... G06F 3/0488; G06F 3/04883; G06F 3/04886; G06F 2200/1634; G06F 2203/0339; G06F 2203/04101; G06F 2203/04103; G06F 2203/04104; G06F 2203/04105; G06F 2203/04; G06F 2203/04107; G06F 2203/04108; G06F 2203/04111; G06F 2203/04112; G06F 2207/482; H01L 23/5222; H01L 23/5228; H01L 23/642; H01L 23/5223; H01L 23/5226; H01L 23/5227; H01L 23/645; H01L 23/647; H01L 27/101; H01L 27/1255; H01L 27/323; H01L 28/10; H01L 28/20; H01L 28/40; H01L 29/4175; H01L 29/7408; H01L 51/05; H01L 2223/6655; H01L 2924/1205; H01L 2924/1206; H01L 2924/1207; H01L 2924/19041; H01L 2924/19042; H01L 2924/19043; H01L 2924/30105; H01L 2924/30107; H01L 2924/3011; H01L 2924/19; H01L 2924/30101
USPC ........................................................ 345/173
See application file for complete search history.

(56) References Cited

U.S. PATENT DOCUMENTS

| | | | |
|---|---|---|---|
| 2016/0048229 A1* | 2/2016 | Chi | G06F 3/041 345/173 |
| 2016/0328043 A1* | 11/2016 | Moller | G06F 3/044 |
| 2016/0334900 A1* | 11/2016 | Heikkinen | G06F 3/0412 |
| 2017/0012232 A1* | 1/2017 | Kataishi | C09K 11/06 |
| 2017/0185183 A1* | 6/2017 | Sundararajan | G06F 3/044 |

\* cited by examiner

Fig.9

TOUCH SUBSTRATE, ITS MANUFACTURING METHOD AND DISPLAY DEVICE

CROSS-REFERENCE TO RELATED APPLICATION

The present application claims a priority of the Chinese Patent Application No. 201610094893.X filed on Feb. 19, 2016, which is incorporated herein by reference in its entirety.

TECHNICAL FIELD

The present disclosure relates to the field of display technology, in particular to a touch substrate, its manufacturing method and a display device.

BACKGROUND

Along with the development of the display technology, touch panels have been widely applied to such electronic devices as mobile phones and flat-panel computers. In the case that a surface of the touch panel is touched by a user's finger, it is able to detect a touch position and make a response in accordance with a change in an internal circuit of the display panel or a change in the capacitance.

The touch panel includes a display module and a touch module. Usually, the touch module is adhered onto the display module through an optical adhesive, so as to form the display panel with a touch function. However, the touch module is usually arranged outside the display module, and the accuracy of the touch detection may be adversely affected by an assembly tolerance. Hence, there is an urgent need to integrate the touch sensing element into the display module.

SUMMARY

An object of the present disclosure is to provide a touch substrate, its manufacturing method and a display device, so as to integrate a touch sensing element into a display module, thereby to achieve a touch detection function.

In one aspect, the present disclosure provides in some embodiments a touch substrate, including a base substrate provided with a plurality of via-holes, a first electrode arranged at a first surface of the base substrate and covering the plurality of via-holes, and a plurality of second electrodes arranged at a second surface of the base substrate opposite to the first surface and each located at a position corresponding to a touch region. An elastic conductor is arranged in each via-hole and capable of electrically connecting the first electrode to at least one of the second electrodes in the case that the base substrate is being pressed, and each second electrode corresponds to at least one elastic conductor. The first electrode is connected to a bias voltage input end, and the second electrodes are each connected to a respective detection signal output end via a respective detection line.

Alternatively, the elastic conductor is made of conductive foam or transparent conductive silica gel.

Alternatively, the first electrode and the second electrodes are transparent electrodes.

Alternatively, the first electrode and the second electrodes are each made of indium tin oxide, zinc oxide or silver nanoparticles.

Alternatively, each elastic conductor is in contact with one of the second electrodes.

Alternatively, each second electrode is located at a position corresponding to at least one via-hole.

Alternatively, the elastic conductors in a plurality of via-holes corresponding to the same second electrode are of two or more kinds of sizes.

Alternatively, the elastic conductors in a plurality of via-holes corresponding to the same second electrode are each coated at one side with an insulation layer.

Alternatively, each second electrode includes a plurality of strip-like portions arranged parallel to each other and a connection portion, the plurality of strip-like portions is connected to the detection line via the connection portion, and each strip-like portion is in contact with a corresponding elastic conductor.

Alternatively, each second electrode is located at a position corresponding to a plurality of via-holes, and upper surfaces of the elastic conductors in the plurality of via-holes corresponding to the same second electrode are separated from the first electrode at two or more kinds of distances.

Alternatively, surfaces of the elastic conductors in the plurality of via-holes corresponding to the same second electrode and away from the first electrode are located at an identical level, and the elastic conductors are of two or more kinds of heights.

Alternatively, an insulation layer is arranged below the second electrodes and covers the second electrodes and the via-holes.

Alternatively, the strip-like portions of the second electrodes are of different widths.

Alternatively, each second electrode is located at a position corresponding to one of the via-holes, and the one of the via-holes corresponds to a central region of the second electrode.

Alternatively, each via-hole is arranged between two adjacent second electrodes, and the elastic conductor in each via-hole is in contact with the two adjacent second electrodes.

Alternatively, each via-hole is of a rectangular, circular, elliptical or strip-like shape.

In another aspect, the present disclosure provides in some embodiments a method for manufacturing a touch substrate, including steps of: preparing a base substrate provided with a plurality of via-holes; forming an elastic conductor in each via-hole; forming a first electrode which is arranged at a first surface of the base substrate and covers the plurality of via-holes; and forming a plurality of second electrodes which is arranged at a second surface of the base substrate opposite to the first surface and each of which is located at a position corresponding to a touch region. The first electrode is capable of being electrically connected to at least one of the second electrodes via the elastic conductor in the case that the base substrate is being pressed, and each second electrode corresponds to at least one elastic conductor. The first electrode is connected to a bias voltage input end, and the second electrodes are each connected to a respective detection signal output end via a respective detection line.

In yet another aspect, the present disclosure provides in some embodiments a display device including the above-mentioned touch substrate.

Alternatively, a base substrate of the touch substrate is a cover glass substrate.

Alternatively, the base substrate of the touch substrate is a base substrate of a color filter substrate.

Alternatively, the base substrate of the touch substrate is a base substrate of an array substrate.

According to the touch substrate, its manufacturing method and the display device in the embodiments of the present disclosure, the base substrate is provided with the via-holes, the first electrode and the second electrodes are arranged at two opposite surfaces of the base substrate respectively, and the elastic conductor is arranged in each via-hole. In the case that a touch operation is made, a portion of the base substrate corresponding to a touch position is deformed downward, so as to electrically connect the first electrode and the second electrode via the corresponding elastic conductor, thereby to change a resistance between the corresponding detection signal output end and the bias voltage input end. After a voltage is applied to the bias voltage input end, a voltage at the detection signal output end corresponding to the touch position may change. As a result, through detecting the change in the voltage at the detection signal output end, it is able to achieve the touch detection.

As compared with the related art where an additional touch module is provided, the touch sensing element is integrated into the base substrate in the embodiments of the present disclosure. As a result, it is able to achieve the touch detection by merely adding a process for forming the corresponding electrodes and a process for forming the elastic conductors in the via-holes during the manufacture of the base substrate.

BRIEF DESCRIPTION OF THE DRAWINGS

The features and advantages of the present disclosure will be more apparent with reference to the drawings. The following drawings are for illustrative purposes only, but shall not be used to limit the present disclosure. In the drawings.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
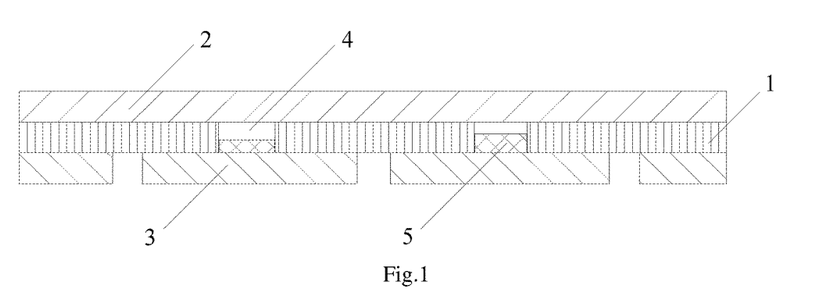
FIG. 1 is a schematic view showing a touch substrate according to one embodiment of the present disclosure.
Figure 2:
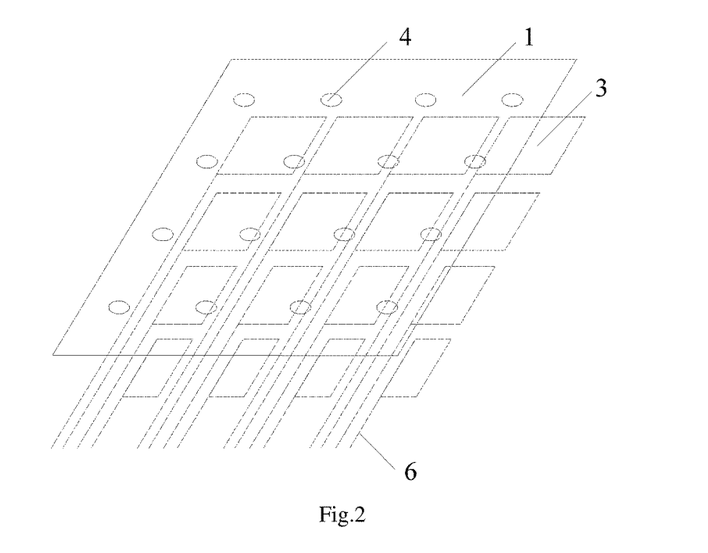
FIG. 2 is a schematic view showing a base substrate and a plurality of second electrodes in FIG. 1.

As shown in FIGS. 1 and 2, the present disclosure provides in some embodiments a touch substrate, which includes a base substrate 1 provided with a plurality of via-holes 4, a first electrode 2 (not shown in FIG. 2) arranged at a first surface (an upper surface) of the base substrate 1 and covering the plurality of via-holes 4, and a plurality of second electrodes 3 arranged at a second surface (a lower surface) of the base substrate 1 opposite to the first surface and each located at a position corresponding to a touch region. An elastic conductor 5 is arranged in each via-hole 4 and capable of electrically connecting the first electrode 2 to at least one of the second electrodes 3 in the case that the base substrate 1 is being pressed, and each second electrode corresponds to at least one elastic conductor. The first electrode 2 is connected to a bias voltage input end, and the second electrodes 3 are each connected to a respective detection signal output end via a respective detection line. It should be appreciated that, the second electrodes 3 in FIG. 2 are merely for illustrative purposes. In the embodiments of the present disclosure, it is unnecessary for the second electrodes to cover the entire touch region, and instead, they may merely have patterns adapted to the via-holes.

It should be further appreciated that, the first electrode 2 is electrically connected to the at least one second electrode 3 via the elastic conductor in the case that the base substrate 1 is being pressed. In the case that the base substrate 1 is not pressed, the electrical connection therebetween may be interrupted or maintained. To be specific, in the case that the electrical connection is interrupted when the base substrate 1 is not pressed, a resistance between the respective detection signal output end and the bias voltage input end may be determined in accordance with different connection states before and after the interruption. In the case that the electrical connection is maintained when the base substrate 1 is not pressed, the resistance therebetween may be determined by detecting a change in a resistance of the elastic conductor due to the deformation of the elastic conductor before and after it is being pressed. In any case, it is able to achieve the touch detection.

It should be appreciated that, the first electrode 2 may cover a part of the upper surface of the base substrate 1 or the entire upper surface thereof, as long as the first electrode 2 covers the via-holes 4 in the base substrate 1.

The first electrode 2 and the second electrodes 3 may be non-transparent electrodes. For example, in the case that the base substrate 1 is a glass substrate for a top-emission organic light-emitting diode (OLED) panel (i.e., light is emitted from the top of the OLED display panel), the glass substrate merely serves as a reflector, and the light emission and the display may not be adversely affected by the non-transparent first electrode and second electrodes. Of course, the first electrode 2 and the second electrodes 3 may also be transparent electrodes. For example, for a bottom-emission OLED panel or liquid crystal display device, the light emission and the display may not be adversely affected by the transparent first electrode and second electrodes on the base substrate 1. During the implementation, the first electrode 2 and the second electrodes 3 may be made of indium tin oxide, zinc oxide or silver nanoparticles.

It should be appreciated that, the via-holes 4 may be each of a rectangular, circular, elliptical or strip-like shape. The number of the via-holes 4 may be identical to, or different from, the number of the second electrodes 3, as long as any one of the second electrodes 3 at least partially covers one via-hole 4 and the first electrode 2 is electrically connected to the second electrode 3 via the elastic conductor 5 in the via-hole 4 at the corresponding touch region in the case that the touch has been made.

The elastic conductor 5 may be made of conductive foam or transparent conductive silica gel.

In the embodiments of the present disclosure, the first electrode 2 and the second electrodes 3 are arranged at the two opposite surfaces of the base substrate 1 provided with the via-holes 4, and the elastic conductor 5 is arranged in each via-hole 4. In the case that the touch has been made, the base substrate 1 is deformed downward at a touch position, so as to electrically connect the first electrode 2 to the corresponding second electrode 3 via the elastic conductor, thereby to change the resistance between the corresponding detection signal output end and the bias voltage input end. Hence, after a voltage $U_0$ is applied to the bias voltage input end, a voltage outputted by the corresponding detection signal output end may change. Through detecting the voltage change at the detection signal output end, it is able to achieve the touch detection.

As compared with the related art where an additional touch module is provided, the touch sensing element is integrated into the base substrate 1 in the embodiments of the present disclosure. As a result, it is able to achieve the touch detection by merely adding a process for forming the corresponding electrodes and a process for forming the elastic conductors 5 in the via-holes 4 during the manufacture of the base substrate 1.

It should be appreciated that, the voltage change on the second electrode 3 may be detected in the following way. A detection line 6 extracted from each second electrode 3 may be connected to a signal processing circuit via the corresponding detection signal output end, and the voltage change on the second electrode 3 may be detected by the signal processing circuit. A driver integrated circuit (IC) of a display device may be directly used as the signal processing circuit.

Figure 3:
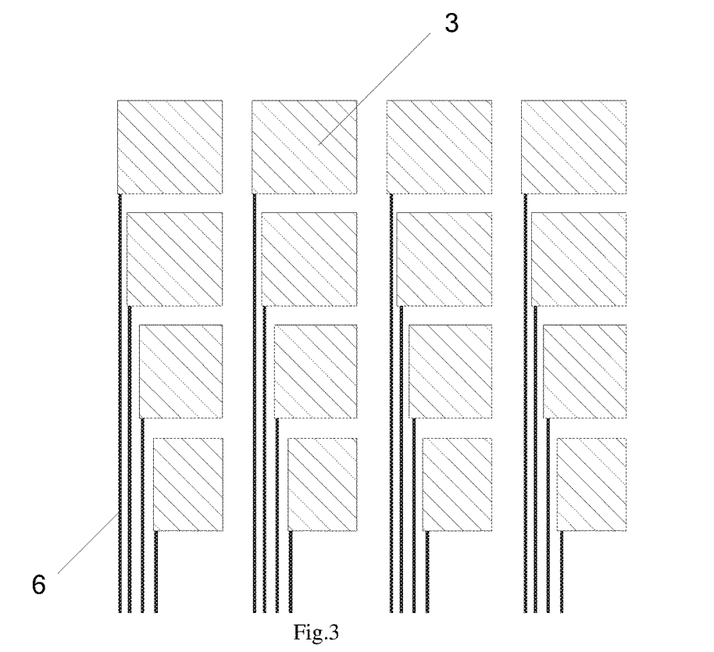
FIG. 3 is a schematic view showing the second electrodes according to one embodiment of the present disclosure.

In order to facilitate the layout of the detection lines 6, in an alternative embodiment, the second electrodes 3 may be arranged in an m*n array form at the lower surface of the base substrate 1, and any two of them do not intersect or overlap each other. In addition, the detection lines 6 may be extracted from the second electrodes 3 at an identical side, as shown in FIG. 3.

In order to improve the versatility of the touch substrate, in an alternative embodiment, the first electrode 2 and the second electrodes 3 are all transparent electrodes. In this way, it is able to prevent the display operation of the display device from being adversely affected, no matter whether they are applied to the bottom-emission OLED display device, the top-emission OLED display device or the liquid crystal display device.

The following description will be given in the case that the first electrode 2 and the second electrodes 3 are all transparent electrodes.

During the implementation, the via-holes 4 may be arranged in the base substrate 1 in the following modes.

In a first mode, as shown in FIGS. 1 and 2, each via-hole 4 may correspond to one of the second electrodes 3 at the lower surface of the base substrate 1. To be specific, the via-hole 4 may be arranged at a position corresponding to any portion of the second electrode 3. In order to improve the accuracy of the touch detection, the via-hole 4 may be arranged at a position corresponding to a central region of the second electrode 3.

Figure 4:
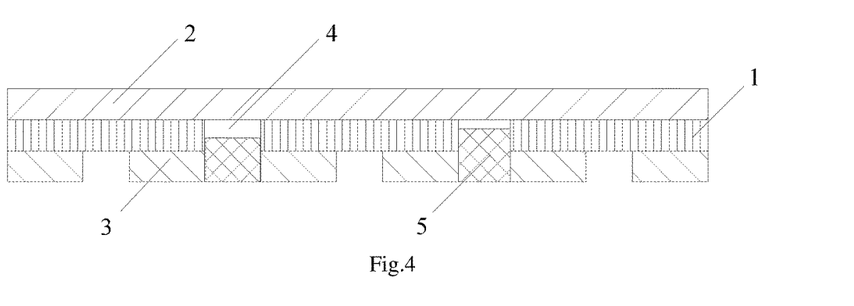
FIG. 4 is another schematic view showing the touch substrate according to one embodiment of the present disclosure.

In a second mode, as shown in FIG. 4, each via-hole 4 is arranged between two adjacent second electrodes 3, and the elastic conductor in each via-hole 4 is in contact with the two adjacent second electrodes 3.

In a third mode, at least one via-holes 4 are arranged at the touch region corresponding to each second electrode 3, so as to improve the sensitivity of the touch detection.

Figure 5:
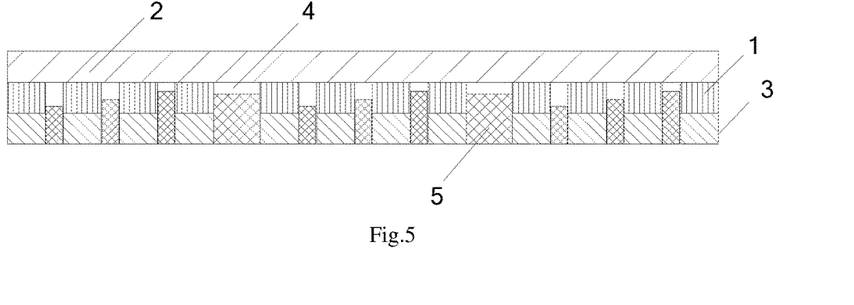
FIG. 5 is yet another schematic view showing the touch substrate according to one embodiment of the present disclosure.

In a fourth mode, as shown in FIG. 5, on the basis of the third mode, the via-hole 4 is also arranged between the two adjacent second electrodes 3.

Figure 6:
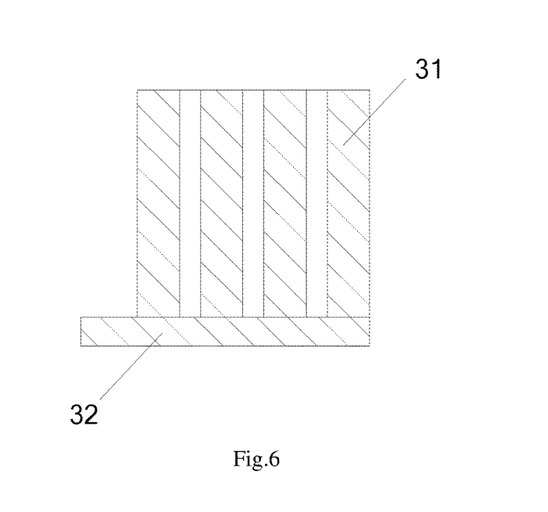
FIG. 6 is a bottom view of the second electrode in FIG. 5.

In order to improve the accuracy of the touch detection, i.e., to further determine an accurate touch position while determining a pressed region, alternatively, as shown in FIG. 6, each second electrode 3 includes a plurality of strip-like portions 31 arranged parallel to each other and a connection portion 32. The plurality of strip-like portions 31 is connected to the detection line 6 via the connection portion 32, and each strip-like portion 31 is, at its top end, in contact with a corresponding elastic conductor, so as to form parallel branches from the first electrode 2 to the connection portion 32.

Figure 7:
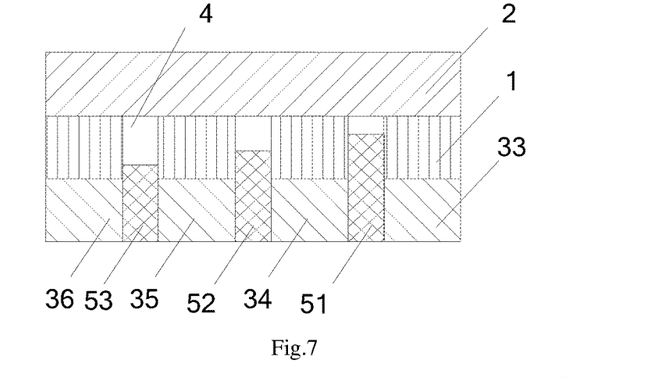
FIG. 7 is a topical schematic view showing the position relationship between the second electrode and the base substrate in FIG. 5.

In order to detect a pressure applied onto the base substrate 1, alternatively, as shown in FIGS. 5 and 7, each second electrode 3 corresponds to more than one via-holes 4, and upper surfaces of the elastic conductors 5 in more than one via-holes 4 corresponding to the same second electrode 3 are separated from the first electrode 2 at two or more kinds of distances. In this way, it is able for the first electrode 2 to be electrically connected to different number of the strip-like portions 31 of the second electrode 3 in response to different pressures applied onto the base substrate 1, thereby to detect the pressures in more accurate manner.

In an alternative embodiment, lower surfaces of the elastic conductors 5 in the via-holes 4 may be located at an identical level, and the elastic conductors 5 may be of two or more kinds of heights, so that the upper surfaces of the elastic conductors 5 in the via-holes 4 corresponding to the same second electrode 3 are separated from the first electrode 2 at two or more kinds of distances. It should be appreciated that, any other ways may also be adopted, so as to provide different gaps between the upper surfaces of the elastic conductors 5 and the first electrode 2.

It should be appreciated that, the following ways may be adopted so as to enable the lower surfaces of the elastic conductors 5 to be at an identical level.

In a first way, an insulation layer may be arranged below the second electrodes 3 and cover the second electrodes 3 and the via-holes 4.

In a second way, the via-holes 4 in the base substrate 1 are each of a relatively small size, and during the implementation, the touch substrate may be in contact with any elements of the display device. For a liquid crystal display device, in the case that the base substrate 1 is a base substrate of an array substrate, an optical film on the array substrate may be used so as to enable the lower surfaces of the elastic conductors 5 to be at an identical level to the lower surface of the base substrate 1.

During the implementation, the number of the strip-like portions 31 of each second electrode 3, and sizes and types of the elastic conductors 5 in the via-holes 4 may be set in accordance with levels of pressures desired to be detected. In the case that three levels of pressures need to be detected, each second electrode 3 may be provided with four strip-like portions, and three elastic conductors 5 with different sizes, e.g., a first elastic conductor 51, a second elastic conductor 52 and a third elastic conductor 53, may be provided, as shown in FIG. 7.

For ease of understanding, a $1^{st}$ pressure level refers to a minimum touch pressure, and the larger the touch pressure, the higher the level. R1 represents a resistance of a first strip-like portion 33 of the second electrode 3, R2 represents a resistance of a second strip-like portion 34 of the second electrode 3, R3 represents a resistance of a third strip-like portion 35 of the second electrode 3, and R4 represents a resistance of a fourth strip-like portion 36 of the second electrode 3. Referring to FIG. 7, in the case of the $1^{st}$ pressure level, merely the first strip-like portion 33 and the second strip-like portion 34 of the second electrode 3 are electrically connected to the first electrode 2 via the first elastic conductor 51. At this time, the first strip-like portion 33 and the second strip-like portion 34 are connected in parallel, and a resistance between the first electrode 2 and the connection portion 32 is equal to a parallel resistance of R1 and R2, i.e., Rx=R1//R2 (in the context, "//" represents "parallel connection"). In the case of a $2^{nd}$ pressure level, the first strip-like portion 33, the second strip-like portion 34 and the third strip-like portion 35 are electrically connected to the first electrode 2 via the first elastic conductor 51 and the second elastic conductor 52. At this time, the first strip-like portion 33, the second strip-like portion 34 and the third strip-like portion 35 are connected in parallel, and the resistance between the first electrode 2 and the connection portion 32 is equal to a parallel resistance of R1, R2 and R3, i.e., Rx=R1//R2//R3. In the case of a $3^{rd}$ pressure level, the first strip-like portion 33, the second strip-like portion 34, the third strip-like portion 35 and the fourth strip-like portion 36 are electrically connected to the first electrode 2 via the first elastic conductor 51, the second elastic conductor 52 and the third elastic conductor 53. At this time, the first strip-like portion 33, the second strip-like portion 34, the third strip-like portion 35 and the fourth strip-like portion 36 are connected in parallel, and the resistance between the first electrode 2 and the connection portion 32 is equal to a parallel resistance of R1, R2, R3 and R4, i.e., Rx=R1//R2//R3//R4. In the case that the first electrode 2 is electrically connected to the connection portion 32 via different number of strip-like portions, it is able to detect different voltages across the corresponding detection line 6 connected to the connection portion 32, thereby to determine the pressure level in accordance with the detected voltage.

Figure 8:
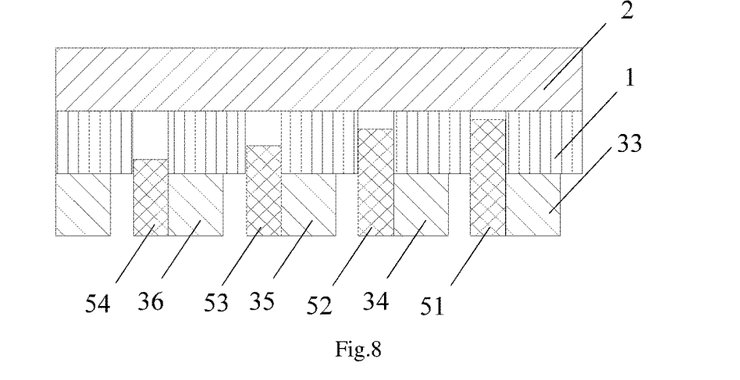
FIG. 8 is another topical schematic view showing the position relationship between the second electrode and the base substrate.

It should be further appreciated that, each second electrode 3 may be provided with four strip-like portions, and four kinds of elastic conductors 5 with different sizes, e.g., the first elastic conductor 51, the second elastic conductor 52, the third elastic conductor 53 and a fourth elastic conductor 54, may be provided, so as to detect four levels of pressures, as shown in FIG. 8. The strip-like portions may be shaped and located in such a manner that each elastic conductor 5 is merely in contact with one of the strip-like portions. Referring to FIG. 8, in the case of the $1^{st}$ pressure level, merely the first strip-like portion 33 of the second electrode 3 is electrically connected to the first electrode 2 via the first elastic conductor 51. At this time, a resistance between the first electrode 2 and the connection portion 32 is equal to R1, i.e., Rx=R1. In the case of the $2^{nd}$ pressure level, the first strip-like portion 33 and the second strip-like portion 34 of the second electrode 3 are electrically connected to the first electrode 2 via the first elastic conductor 51 and the second elastic conductor 52. At this time, the first strip-like portion 33 and the second strip-like portion 34 are connected in parallel, and the resistance between the first electrode 2 and the connection portion 32 is equal to a parallel resistance of R1 and R2, i.e., Rx=R1//R2. Similarly, in the case of the $3^{rd}$ pressure level, Rx=R1//R2//R3, and in the case of a $4^{th}$ pressure level, Rx=R1//R2//R3//R4. Hence, through the four strip-like portions, it is able to detect the four levels of pressures.

It should be further appreciated that, the detection of multiple levels of pressures through the four strip-like portions and the four kinds of elastic conductors 5 with different sizes may be achieved in the following ways.

In a first way, before placing each elastic conductor 5 into the via-hole, it is coated at one side with an insulation layer, so that the elastic conductor 5 is merely in contact with one strip-like portion. For example, the first elastic conductor 51 in FIG. 7 may be coated at its left side with the insulation layer, so that the first elastic conductor 51 is merely in contact with the first strip-like portion 33 but insulated from the second strip-like portion 34. The second elastic conductor 52, the third elastic conductor 53 and the fourth elastic conductor 54 may be coated with the insulation layers in a similar manner.

In a second way, a width of each elastic conductor 5 in the via-hole may be adjusted in a manner that it is merely in contact with one strip-like portion. For example, the first elastic conductor 51 in FIG. 7 may be in contact with the first strip-like portion 33 but separated from the second strip-like portion 34, and in the case of the $1^{st}$ pressure level, the first electrode 2 is merely electrically connected to the first strip-like portion 33 via the first elastic conductor 51. The second elastic conductor 52, the third elastic conductor 53 and the fourth elastic conductor 54 may be arranged in a similar manner.

The first strip-like portion 33, the second strip-like portion 34, the third strip-like portion 35 and the fourth strip-like portion 36 may be of an identical resistance. Of course, they may also be of different resistances so as to improve the accuracy of the touch detection, and at this time, the strip-like portions may be of different widths.

It should be appreciated that, in the case that the base substrate 1 is not touched any more, it may be recovered to its original form. Of course, the elastic conductor 5 in the via-hole 4 may also be recovered to its original form for the detection of a next touch operation.

Figure 9:
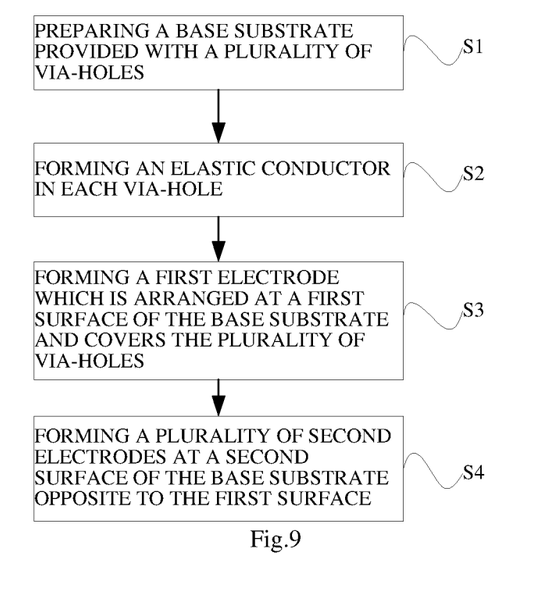
FIG. 9 is a flow chart of a method for manufacturing the touch substrate according to one embodiment of the present disclosure.

The present disclosure further provides in some embodiments a method for manufacturing the touch substrate which, as shown in FIG. 9, includes Step S1 of preparing the base substrate provided with a plurality of via-holes; Step S2 of forming the elastic conductor in each via-hole; Step S3 of forming the first electrode which is arranged at the first surface of the base substrate and covers the plurality of via-holes; and Step S4 of forming a plurality of second electrodes which is arranged at the second surface of the base substrate opposite to the first surface and each of which is located at a position corresponding to a touch region. The first electrode is capable of being electrically connected to at least one of the second electrodes via the elastic conductor in the case that the base substrate is being pressed, and each second electrode corresponds to at least one elastic conductor. The first electrode is connected to a bias voltage input end, and the second electrodes are each connected to the respective detection signal output end via the respective detection line.

During the implementation, in Step S1, the via-holes may be formed while manufacturing the base substrate through an injection molding machine, or formed by punching in the base substrate.

In Step S2, the elastic conductor may be injected into each via-hole. In the case that the touch pressure needs to be detected in an accurate manner, the elastic conductors may be of different sizes. The lower surfaces of the elastic conductors of different sizes may be located at an identical level to the lower surface of the base substrate, and the elastic conductors may be separated from the upper surface of the base substrate at different distances, so as to enable the first electrode to be electrically connected to different number of second electrodes in the case that different pressures are applied to the base substrate, thereby to detect the touch pressure in an accurate manner.

In Step S3, the first electrode may be deposited onto the base substrate. In Step S4, the second electrodes may be formed on the base substrate through depositing, masking, developing, etching and removing processes sequentially, and each second electrode corresponds to a touch region.

In order to detect the pressure in a more accurate manner, each second electrode may be provided, through a specific mask plate, with a plurality of strip-like portions arranged parallel to each other and a connection portion. Each strip-like portion is connected to the corresponding detection line via the connection portion, and it is in contact with the corresponding elastic conductor.

The present disclosure further provides in some embodiments a display device including the above-mentioned touch substrate. According to the embodiments of the present disclosure, the touch sensing element is integrated into the base substrate, so it is able to achieve the touch detection by merely adding a process for forming the corresponding electrodes and a process for forming the elastic conductors in the via-holes during the manufacture of the base substrate.

During the implementation, the base substrate of the touch substrate may be a cover glass substrate, a base substrate of a color filter substrate, or a base substrate of an array substrate.

It should be appreciated that, the display device may be any product or member having a display function, such as a display panel, an electronic paper, a mobile phone, a flat-panel computer, a television, a laptop computer, a digital photo frame, or a navigator.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A touch substrate, comprising:
   a base substrate provided with a plurality of via-holes;
   a first electrode arranged at a first surface of the base substrate and covering the plurality of via-holes; and
   a plurality of second electrodes arranged at a second surface of the base substrate opposite to the first surface and each located at a position corresponding to a touch region;
   wherein an elastic conductor is arranged in each via-hole and capable of electrically connecting the first electrode to at least one of the second electrodes when the base substrate is being pressed, each second electrode corresponds to at least one elastic conductor, the first electrode is connected to a bias voltage input end, and the second electrodes are each connected to a respective detection signal output end via a respective detection line, wherein the elastic conductor comprises at least one of conductive foam or transparent conductive silica gel.

2. The touch substrate according to claim 1, wherein the first electrode and the second electrodes are transparent electrodes.

3. The touch substrate according to claim 1, wherein the first electrode and the second electrodes comprises at least one of indium tin oxide, zinc oxide, or silver nanoparticles.

4. The touch substrate according to claim 1, wherein each elastic conductor is in contact with at least one of the second electrodes.

5. The touch substrate according to claim 1, wherein each second electrode is located at a position corresponding to at least one via-hole.

6. The touch substrate according to claim 5, wherein elastic conductors in a plurality of via-holes corresponding to a same second electrode are of two or more kinds of sizes.

7. The touch substrate according to claim 5, wherein elastic conductors in a plurality of via-holes corresponding to a same second electrode are each coated at one side with an insulation layer.

8. The touch substrate according to claim 1, wherein each second electrode comprises a plurality of strip-like portions arranged parallel to each other and a connection portion, the plurality of strip-like portions is connected to the detection line via the connection portion, and each strip-like portion is in contact with a corresponding elastic conductor.

9. The touch substrate according to claim 8, wherein each second electrode is located at a position corresponding to at least one via-hole, and upper surfaces of the elastic conductors in a plurality of via-holes corresponding to a same second electrode are separated from the first electrode at two or more kinds of distances.

10. The touch substrate according to claim 9, wherein surfaces of the elastic conductors in the plurality of via-holes corresponding to the same second electrode and away from the first electrode are located at an identical level.

11. The touch substrate according to claim 10, wherein an insulation layer is arranged below the second electrodes and covers the second electrodes and the via-holes.

12. The touch substrate according to claim 8, wherein the strip-like portions of the second electrodes are of different widths.

13. The touch substrate according to claim 1, wherein each via-hole is arranged between two adjacent second electrodes, and the elastic conductor in each via-hole is in contact with the two adjacent second electrodes.

14. The touch substrate according to claim 1, wherein each via-hole comprises at least one of a rectangular, circular, elliptical, or strip-like shape.

15. A display device, comprising the touch substrate according to claim 1.

16. The display device according to claim 15, wherein a base substrate of the touch substrate is a cover glass substrate.

17. The display device according to claim 15, wherein a base substrate of the touch substrate is a base substrate of a color filter substrate.

18. The display device according to claim 15, wherein a base substrate of the touch substrate is a base substrate of an array substrate.

19. A method for manufacturing a touch substrate, comprising:
 preparing a base substrate provided with a plurality of via-holes;
 forming an elastic conductor in each via-hole;
 forming a first electrode which is arranged at a first surface of the base substrate and covers the plurality of via-holes; and
 forming a plurality of second electrodes which is arranged at a second surface of the base substrate opposite to the first surface and each of which is located at a position corresponding to a touch region,
 wherein the first electrode is capable of being electrically connected to at least one of the second electrodes via the elastic conductor when the base substrate is being pressed, each second electrode corresponds to at least one elastic conductor, the first electrode is connected to a bias voltage input end, and the second electrodes are each connected to a respective detection signal output end via a respective detection line, wherein the elastic conductor is made of conductive foam or transparent conductive silica gel.

\* \* \* \* \*